US006809986B2

United States Patent
Kim et al.

(10) Patent No.: US 6,809,986 B2
(45) Date of Patent: Oct. 26, 2004

(54) SYSTEM AND METHOD FOR NEGATIVE WORD LINE DRIVER CIRCUIT

(75) Inventors: Tae Hyoung Kim, Boise, ID (US); Huy Vo, Boise, ID (US); Greg Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 49 days.

(21) Appl. No.: 10/232,953

(22) Filed: Aug. 29, 2002

(65) Prior Publication Data

US 2004/0042322 A1 Mar. 4, 2004

(51) Int. Cl.[7] .............................................. G11C 8/00
(52) U.S. Cl. ........................ 365/230.06; 365/189.01; 365/189.07; 365/189.09; 365/191; 365/226
(58) Field of Search ...................... 365/230.06, 191, 365/226, 189.07, 189.01, 189.09

(56) References Cited

U.S. PATENT DOCUMENTS

| | | | |
|---|---|---|---|
| 5,297,104 A | 3/1994 | Nakashima | 365/230.06 |
| RE34,797 E | 11/1994 | Sato et al. | 365/189.09 |
| 5,396,459 A | 3/1995 | Arakawa | 365/185 |
| 5,406,523 A | 4/1995 | Foss et al. | 365/226 |
| 5,668,758 A | 9/1997 | Yiu et al. | 365/185.23 |
| 5,699,313 A | 12/1997 | Foss et al. | 365/226 |
| 5,703,827 A * | 12/1997 | Leung et al. | 365/230.06 |
| 5,729,494 A | 3/1998 | Gotou et al. | 365/185.24 |
| 5,748,530 A | 5/1998 | Gotou et al. | 365/185.18 |
| 5,805,508 A | 9/1998 | Tobita | 365/189.09 |
| 5,828,620 A | 10/1998 | Foss et al. | 365/226 |
| 5,999,456 A | 12/1999 | Sali et al. | 365/185.28 |
| 6,046,956 A | 4/2000 | Yabe | 365/230.06 |
| 6,069,825 A | 5/2000 | Tang | 365/185.27 |
| 6,166,987 A * | 12/2000 | Atsumi et al. | 365/230.06 |
| 6,198,685 B1 | 3/2001 | Sudo et al. | 365/230.06 |
| 6,208,575 B1 | 3/2001 | Proebsting | 365/208 |
| 6,249,458 B1 | 6/2001 | Shokouhi et al. | 365/185.23 |
| 6,327,194 B1 | 12/2001 | Kurihara et al. | 365/189.09 |
| 6,426,908 B1 | 7/2002 | Hidaka | 365/222 |
| 6,504,753 B1 | 1/2003 | Scheuerlein et al. | 365/175 |
| 6,538,930 B2 | 3/2003 | Ishii et al. | 365/189.09 |
| 6,538,955 B2 * | 3/2003 | Kohno | 365/230.06 |
| 6,545,923 B2 | 4/2003 | Sim et al. | 365/204 |
| 6,597,624 B2 | 7/2003 | Aritomi | 365/230.06 |
| 6,614,696 B2 | 9/2003 | Kanno et al. | 365/187 |
| 6,618,295 B2 | 9/2003 | Scheuerlein | 365/189.09 |

* cited by examiner

Primary Examiner—Michael S. Lebentritt
Assistant Examiner—Pho M. Luu
(74) Attorney, Agent, or Firm—Dorsey & Whitney, LLP (57) ABSTRACT

A negative word line driver employs devices to maintain the potential difference between the active word line signal and the inactive word line signal while reducing the need for a significant negative voltage supply. One form of the negative word line driver employs an isolation element to couple the word line to ground when the inputs to the word line driver indicate the word line should not be active, while the word line is also coupled to the negative voltage supply. Another form of the form of the negative word line driver receives as inputs the voltages to be driven on the word line and can be implemented with fewer transistors but still allows the word line to be driven at a negative voltage with a reduced negative voltage supply.

102 Claims, 6 Drawing Sheets

SYSTEM AND METHOD FOR NEGATIVE WORD LINE DRIVER CIRCUIT

TECHNICAL FIELD

This invention relates to computer memory systems. More particularly, the present invention relates to improving word line driver circuitry.

BACKGROUND OF THE INVENTION

Dynamic random access memory (DRAM) devices provide a relatively inexpensive way to provide a large system memory. DRAM devices are relatively inexpensive because, in part, as compared to other memory technologies, a typical single DRAM cell consists only of two components: an access transistor and a capacitor. The access transistor is typically a metal oxide (MOS) transistor having a gate, a drain, and a source, as will be understood by those skilled in the art. The capacitor, which stores a high or low voltage representing high and low data bits, respectively, is coupled between the drain of the access transistor and a cell plate charged to Vcc/2. The gate of the access transistor is coupled to a word line and the source is coupled to a digit line. Thus, activating the word line turns on the transistor, coupling the capacitor to the digit line and thereby enabling data to be read from the DRAM cell by sensing the voltage at the digit line. Data is written to the DRAM cell by applying a desired voltage to the digit line.

DRAM technology is an inherently transitory nature storage technology. As is well known in the art, the storage capability of the DRAM cell is transitory in nature because the charge stored on the capacitor leaks. The charge can leak, for example, across the plates of the capacitor or out of the capacitor through the access transistor. The leakage current through a MOS transistor is an unwanted current flowing from drain to source even when the gate-to-source voltage of the transistor is less than the threshold voltage, as will be understood by those skilled in the art. As a result, DRAM cells must be refreshed many times per second to preserve the data stored. The refresh process being repeated many times per second, consuming an appreciable quantity of power. In portable systems, obtaining the longest life out of the smallest possible battery is a crucial concern, and, therefore, reducing the need to refresh memory cells to reduce power consumption is highly desirable.

The need to refresh memory cells can be reduced by reducing current leakage through the access transistor by increasing the threshold voltage of the access transistor. The semiconducting materials comprising the DRAM cells can be doped to increase the threshold voltage to activate the transistor from a typical level of 0.6 volts to 1.0 or more volts. Increasing the threshold voltage, because of the field effects in the MOS transistors used in typical DRAM cells, reduces the magnitude of current leakage through the access transistor. This is true because, as will be understood by those skilled in the art, when the polarity of the applied gate-to-source voltage causes the transistor to turn OFF, current decreases as the difference between the applied gate-to-source-voltage and threshold voltage increase. Thus, for a given voltage applied on a word line to turn OFF the corresponding access transistors, an increase in the threshold voltage will decrease the leakage current of the transistor for that word line voltage.

Increasing threshold voltage to suppress current leakage, however, becomes a less optimal solution as memory cells are reduced to fit more and more memory cells on a single die. This is because, for example, miniaturization of memory cells results in cell geometries that render the cells vulnerable to damage as higher voltages are applied.

Instead of increasing the threshold voltage of the access transistor and leaving the applied word line voltage the same, leakage current can be reduced by increasing the magnitude of the gate-to-source voltage that is applied to turn OFF the access transistor and leaving the threshold voltage of the transistor the same. Thus, instead of applying zero volts on the word line to turn OFF an NMOS access transistor, a negative voltage of 0.3 volts is applied to the word line, decreasing the transistor's current leakage for a given threshold voltage.

Figure 1:
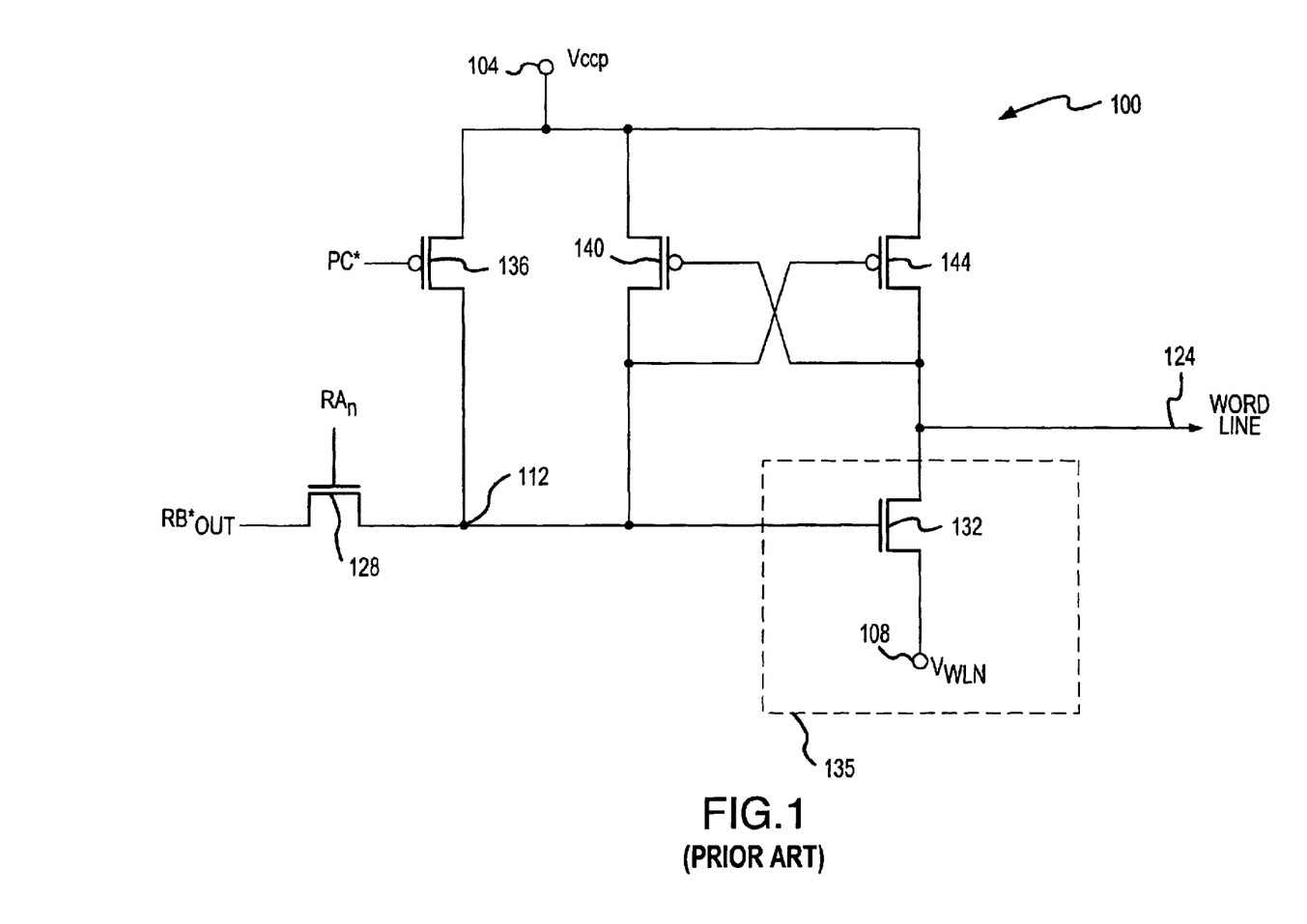
FIG. 1 is a schematic diagram of a prior art negative word line driver.

This approach is utilized in prior art word line drivers as shown in FIG. 1, which shows a prior art negative word line driver circuit 100. The word line driver 100 drives an active word line signal 124 to a voltage of 3.0 volts, Vccp, supplied to the word line driver 100 at Vccp supply line 104. The word line driver 100 drives the word line signal 124 inactive to a voltage of −0.3 volts, Vwln (voltage word line negative), supplied to the word line driver 100 at Vwln supply line 108. The word line driver 100 receives three inputs, PC* (precharge low enable), RAn, and RBout* (low enabled), with both RAn and RBout* being row predecoded addressing signals. The output of the word line driver 100 is the word line signal 124.

In operation, the word line signal 124 goes inactive when PC* is driven low. PC* going active turns ON PMOS transistor 136, thereby applying a high voltage Vccp to transistor 132, coupling the word line signal 124 to Vwln. At the same time, turning ON PMOS transistor 136 drives node 112 high, turning OFF PMOS transistor 144, while the low signal on the word line signal 124 turns ON transistor 140, which keeps node 112 high to keep transistor 132 turned ON independent of the signal carried on PC*.

On the other hand, the word line signal 124 goes active when PC* is driven high, turning OFF PMOS transistor 136. Then, when RAn is driven high, transistor 128 is turned ON, and when RBout* is driven low, node 112 goes low, applying a low signal to transistor 132 and decoupling the word line signal 124 from Vwln. Node 112 going low also turns ON PMOS transistor 144, coupling Vccp to the word line signal 124. The word line signal 124 going high turns OFF PMOS transistor 140, decoupling Vccp from the gate of transistor 132, keeping the word line signal 124 from being coupled to Vwln.

However, for the prior art word line driver 100 to effectively drive Vwln to the memory arrays the word line driver 100 directs, a significant Vwln negative voltage pump or negative voltage supply must be provided. This is problematic, because while the die is provided with Vcc and ground, Vwln typically must be provided within the device itself. As will be appreciated by one skilled in the art, supplying an appreciable Vwln current consumes space on the die, and also wastes power and capacity in generating a negative voltage source of suitable capacity.

Moreover, as is understood by one skilled in the art, a single word line driver circuit 100 is only one of many driver circuits that may be used in a memory array. Memory arrays may comprise thousands of rows of memory cells. Accordingly, the power and space consumption problems involved in a single die are compounded many times over when considering the power and space consumed in a memory system comprising a large memory array.

What is needed is a way to maintain the potential difference between the active word line signal and the inactive word line signal to reduce access transistor current leakage, while at the same time reducing the demand for a large negative voltage source.

SUMMARY OF THE INVENTION

The present invention employs transistors to maintain the potential difference between the active word line signal and the inactive word line signal while reducing the need for a significant negative voltage supply. Generally, the present invention employs transistors in the word line driver to appropriately couple available negative voltage to the word line while reducing the negative voltage capacity needed. In some forms of the invention, two additional transistors are added to the prior art negative word line driver. One diode-coupled transistor is used to couple the word line to ground when the inputs to the word line driver indicate the word line should not be active, while another is then used to couple the word line to the negative voltage supply. The diode-coupled transistor is used to make sure that the negative voltage supply is not coupled to ground so that current does not flow between the negative voltage supply and ground. High signal inputs to the word line driver of the present invention are applied at a control voltage and not at the desired high word line voltage; thus, a translator coupling is used to translate suitable control inputs to the desired high word line voltage.

Another form of the invention receives as inputs the voltages to be driven on the word line. As a result, the word line driver of this form of the invention does not require a translator circuit to drive the word line to the desired high word line voltage, and the word line driver can be implemented with fewer transistors. Still, this form of the invention allows the word line to be driven at a negative voltage with a reduced negative voltage supply as compared to the prior art negative word line driver.

DETAILED DESCRIPTION OF THE INVENTION

Embodiments of the present invention are directed to a negative word line driver that consumes less power while still driving a word line to a negative voltage to reduce current leakage through the access transistors of DRAM memory cells. In the following detailed description of exemplary embodiments of the invention, reference is made to the accompanying drawings, which form a part hereof, and in which are shown, by way of illustration, specific exemplary embodiments in which the invention may be practiced. These embodiments are described in sufficient detail to enable those skilled in the art to practice the invention. However, it will be clear to one skilled in the art that the invention may be practiced without these particular details. Other embodiments may be utilized and modifications may be made without departing from the spirit or scope of the present invention. In particular, while specific voltage levels and transistor couplings are disclosed in the drawings and the accompanying description, other voltage levels and circuit designs may be used in practicing the present invention. The following detailed description is, therefore, not to be taken in a limiting sense, and the scope of the present invention is defined only by the appended claims.

Figure 2A:
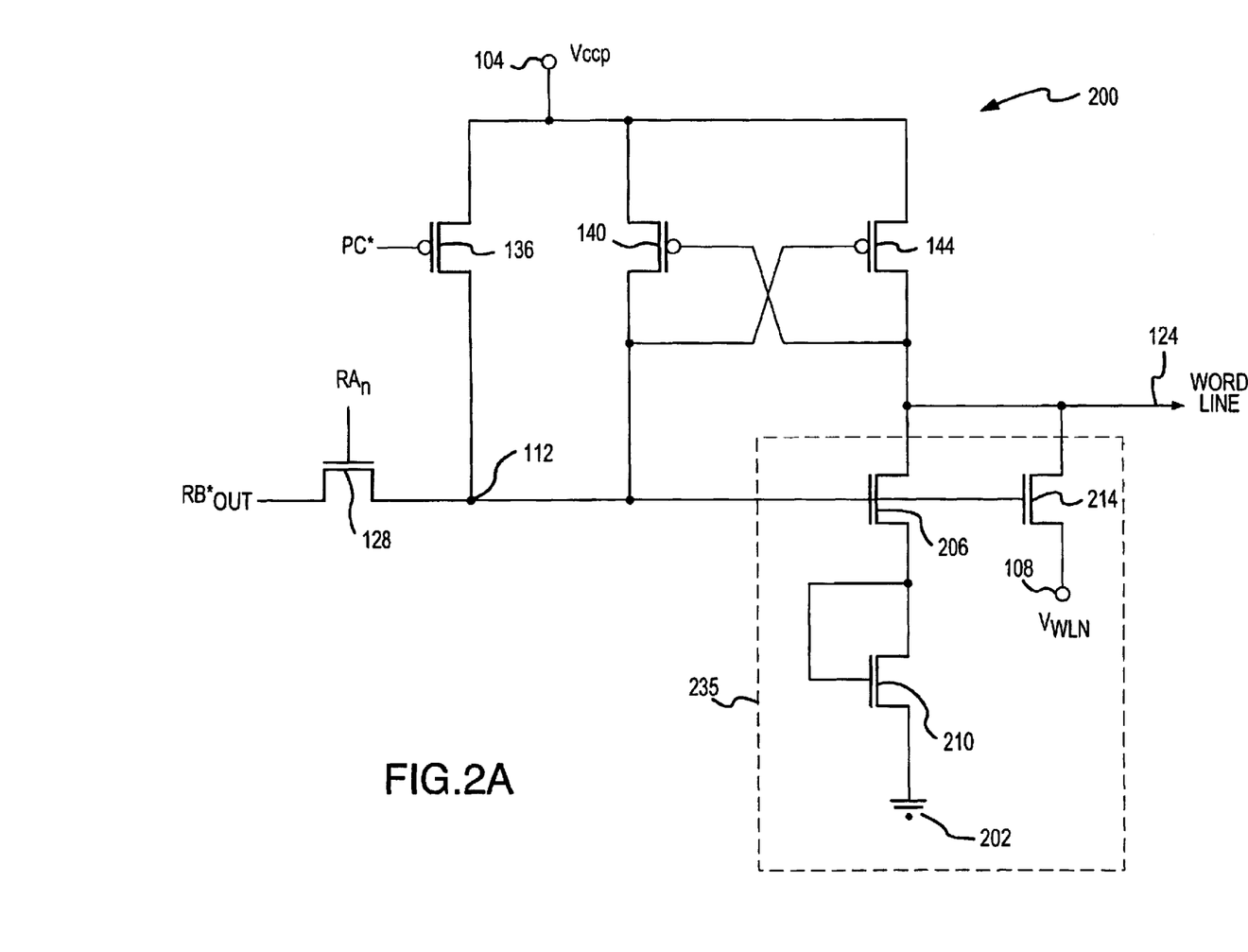
FIG. 2A is a schematic diagram of a negative word line driver using a first embodiment of the present invention coupling the word line to ground with a diode-coupled transistor and to a negative voltage supply with another transistor.

A first embodiment of a negative word line driver 200 of the present invention is shown in FIG. 2A. The negative word line driver 200 comprises most of the same components used in the negative word line driver 100 of FIG. 1. Therefore, in the interest of clarifying the differences and similarities, these components have been provided with the same reference numerals, and an explanation of their functions and operations will be repeated only to the extent necessary to make the functioning of embodiments of the present invention clear.

As in the case of the prior art word line driver 100 depicted in FIG. 1, the word line driver 200 has two states: word line activation mode, during which the word line signal 124 is driven high, and word line deactivation mode, during which the word line signal 124 is driven low. Word line activation mode occurs when PC* is driven high, RAn is driven high, and RBout* is driven low. Word line deactivation mode occurs when PC* is driven low, RAn is driven low, and/or RBout* is driven high. This combination of inputs signals that the row is being precharged, or that the row driven by the word line driver 200 has been not been selected.

A difference between the prior art word line driver 100 depicted in FIG. 1 and the negative word line driver 200 in FIG. 2A is in how the word line signal is coupled to a negative voltage source, Vwln 108. In the prior art word line driver 100 (FIG. 1), a single transistor 132 coupled the word line signal 124 to Vwln 108 when the word line driver 100 was in word line driver deactivation mode. In the word line driver 200 (FIG. 2A) using an embodiment of the present invention, a low driver circuit 235 or low coupling system is used. The low driver circuit 235 comprises a coupling transistor 206, an isolation element 210, in this embodiment, a diode-coupled transistor, and a second voltage coupling transistor 214. In this embodiment, the coupling transistor 206 is connected in series with the isolation element 210, which in turn is connected to ground 202. The second voltage coupling transistor 214 is connected to a negative voltage source, in this embodiment, Vwln at −0.3 volts. When the word line driver is in word line deactivation mode, the coupling transistor 206 and the isolation element 210 couple the word line signal 124 towards ground to discharge positive voltage on the word line signal 124, and the second voltage coupling transistor 214 pulls the discharged word line signal 124 to the negative voltage, Vwln 108.

In operation, word line activation mode in the word line driver 200 operates similarly to the prior art word line driver 100 (FIG. 1). PC* being driven high turns OFF PMOS transistor 136. Then, when RAn is driven high, transistor 128 is turned ON, and when RBout* is driven low, node 112 goes low, applying a low signal to the low driver circuit 235. Specifically, node 112 being driven low turns OFF both the coupling transistor 206 and the second voltage coupling transistor 214, decoupling the word line signal 124 from both ground 202 and Vwln 108. Node 112 being driven low also turns ON PMOS transistor 144, coupling Vccp 104 to the word line signal 124. The word line signal 124 going high turns OFF PMOS transistor 140, decoupling Vccp 104 from the gate of transistor 214 and 206, keeping the word line signal 124 from being coupled to Vwln 108 and ground 202. Thus, in sum, when PC* is driven high, RAn is driven high, and RBout* is driven low, the word line driver 200 is in word line activation mode and the word line signal 124 is driven at Vccp 104.

By contrast, word line deactivation mode in the word line driver 200 operates somewhat differently than the prior art word line driver 100 (FIG. 1). PC* being driven low, for example, turns ON transistor 136, causing node 112 to be driven high. Node 112 being driven high applies a high signal to the low driver circuit 235. Specifically, node 112 being driven high turns ON the coupling transistor 206. Turning ON coupling transistor 206 discharges the word line signal 124, which also turns ON the isolation element 210, the diode-coupled transistor. As a result, the word line signal 124 is discharged towards ground 202. Node 112 being driven high also turns ON the second voltage coupling transistor 214, which pulls the discharged word line signal 124 to the negative voltage, Vwln 108. Also, node 112 being driven high turns OFF PMOS transistor 144, decoupling Vccp 104 from the word line signal. The word line signal 124 being driven low also turns ON PMOS transistor 140, which keeps node 112 high to keep the low driver circuit turned ON independent of the signal carried on PC*.

Coupling the word line signal 124 to both ground 202 and Vwln 108 reduces the Vwln capacity that must be provided. In dropping the voltage on the word line signal 124 to Vwln, most of the voltage on the word line signal 124 can be dropped through the connection to ground 202. The voltage on the word line signal 124 has been dropped to near zero through coupling the word line signal 124 towards ground 202, at the same time a smaller capacity coupling to Vwln 108 can be used to drive the word line the rest of Vwln 108, or −0.3 volts in this example. This is significant because the ground connection is externally and directly provided to the die, and thus need not be generated on the die itself. As a result, a smaller capacity Vwln source can be provided, reducing both the problem of having to design a more significant Vwln conductor on the die and having to waste power and capacity in generating a more significant Vwln negative voltage pump or supply on the die. Similarly, transistor 214 potentially can be a smaller device because the transistor 214 need not carry the full burden of sinking the voltage of the word line signal 124 to Vwln 108.

It should be further appreciated that the diode-coupled transistor 210 permits the flow of positive voltage to ground through the pair of transistors 206 and 210. Otherwise, coupling the word line signal 124 to both ground 202 and Vwln 108 would result in the ground connection sinking negative voltage from Vwln 108 to ground 202. This would wastefully draw on Vwln 108, thereby necessitating a larger Vwln supply. The diode-coupled transistor 210, a diode, or another equivalent current flow control circuit to prevent Vwln from being sunk to ground, helps allow a smaller Vwln source.

Figure 2B:
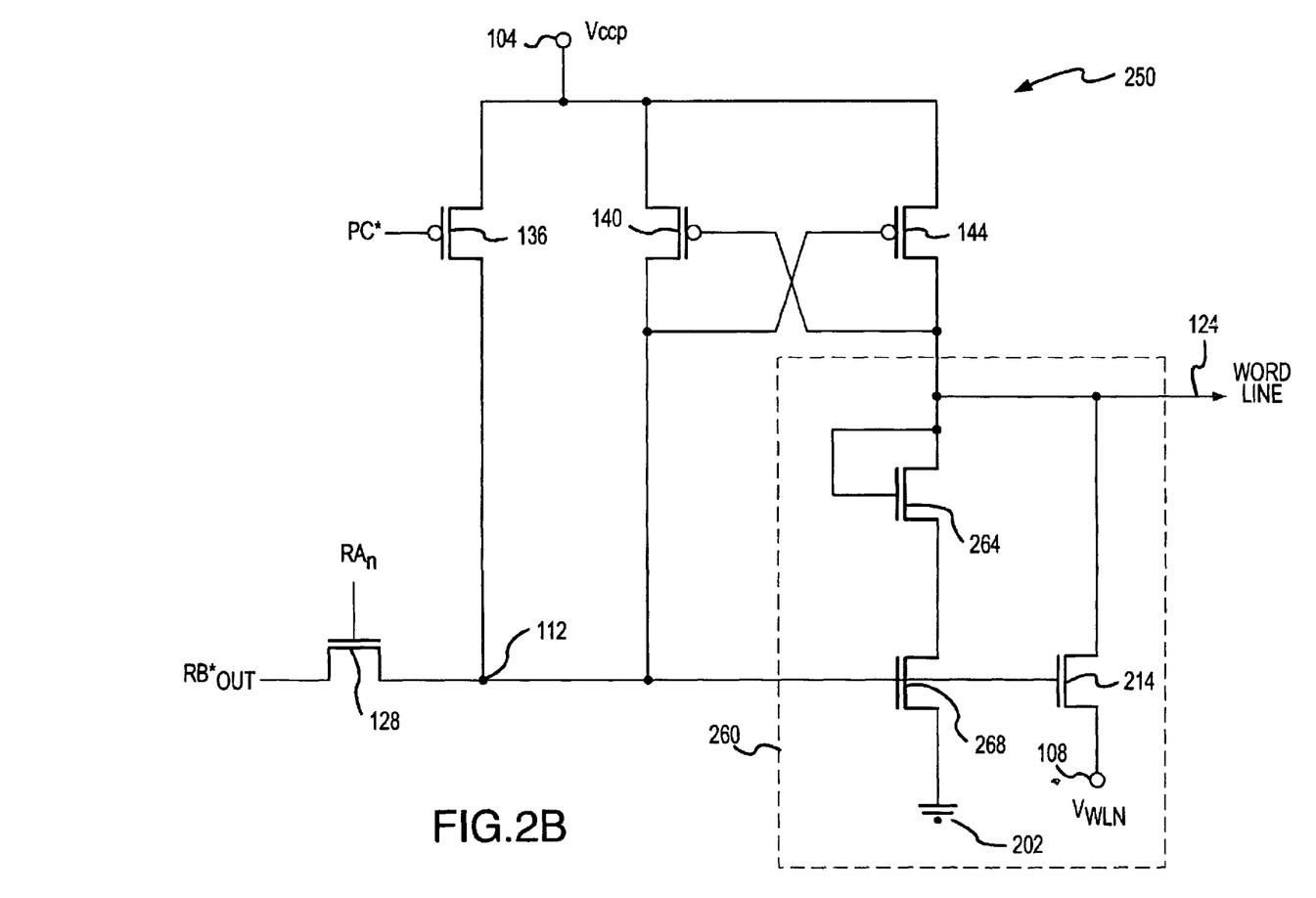
FIG. 2B is a schematic diagram of a negative word line driver using another form of the first embodiment of the present invention coupling the word line to ground with a differently arranged diode-coupled transistor and to a negative voltage supply with another transistor.

FIG. 2B depicts a variation of the first embodiment of the present invention. The word line driver 250 shown in FIG. 2B is very similar to the word line driver 200 (FIG. 2A), with only one significant change in the low driver circuit 260 (FIG. 2B). The negative word line driver 250 comprises most of the same components used in the negative word line driver 200 of FIG. 2A, these components have been provided with the same reference numerals, and their functions will not be explained.

As in the case of the first embodiment of the invention 200 (FIG. 2A), the word line driver 250 has two states: word line activation mode, during which the word line signal 124 is driven high, and word line deactivation mode, during which the word line signal 124 is driven low. Word line activation mode occurs when PC* is driven high, RAn is driven high, and RBout* is driven low. Word line deactivation mode occurs when PC* is driven low, RAn is driven low, and/or RBout* is driven high. This combination of inputs signals that the row is being precharged, or that the row driven by the word line driver 200 has been not been selected.

A difference in the word line driver 250 (FIG. 2B) is that, opposite of word line driver 200 (FIG. 2A), the isolation element 264, in this embodiment a diode-coupled transistor, is coupled between the word line signal 124 and the coupling transistor 268. However, the response of the word line driver 250 in generating active and inactive signals on the word line signal 124 in response to its inputs is the same.

In word line activation mode in the word line driver 250, PC* being driven high turns OFF PMOS transistor 136. Then, when RAn is driven high, transistor 128 is turned ON, and when RBout* is driven low, node 112 goes low, applying a low signal to the low driver circuit 260. Specifically, node 112 being driven low turns OFF both the coupling transistor 268 and the second voltage coupling transistor 214, decoupling the word line signal 124 from both ground 202 and Vwln 108. Node 112 being driven low also turns ON PMOS transistor 144, coupling Vccp 104 to the word line signal 124. The word line signal 124 going high turns OFF PMOS transistor 140, decoupling Vccp 104 from the gate of transistors 214 and 268, keeping the word line signal 124 from being coupled to Vwln 108 and ground 202. Thus, in sum, when PC* is driven high, RAn is driven high, and RBout* is driven low, the word line driver 200 is in word line activation mode and the word line signal 124 is driven at Vccp 104.

On the other hand, in word line deactivation mode, PC* being driven low, for example, turns ON transistor 136, causing node 112 to be driven high. Node 112 being driven high applies a high signal to the low driver circuit 260. Specifically, node 112 being driven high turns ON the coupling transistor 268. Before coupling transistor 268 was turned on, the isolation element 264 was unable to conduct because, in effect, its drain was disconnected from ground. However, once the coupling transistor 268 is turned on, the isolation element 264 conducts to discharge the word signal line 124 through the coupling transistor 268 towards ground 202. Node 112 being driven high also turns ON the second voltage coupling transistor 214, which pulls the discharged word line signal 124 to the negative voltage, Vwln 108. Also, node 112 being driven high turns OFF PMOS transistor 144, decoupling Vccp 104 from the word line signal. The word line signal 124 being driven low also turns ON PMOS transistor 140, which keeps node 112 high to keep the low driver circuit turned ON independent of the signal carried on PC*.

It will be appreciated by one skilled in the art that, instead of diode-coupling transistors 210 (FIG. 2A) and 264 (FIG. 2B), the gates of these transistors could be coupled to a control signal line to deactivate these transistors and isolate the Vwln source 108 from ground 202. There might be electrical advantages in that a direct control signal to the gate of the transistor rather than a source-tied input would more positively discharge word line 124 to ground. Another benefit of a direct control signal to the gate of 210/264 is the ability to first couple the word line to ground, and later couple it to Vwln. However, while there might be electrical advantages to separately controlling transistors 210 (FIG. 2A) and 264 (FIG. 2B), it would require more space on the die.

Figure 3:
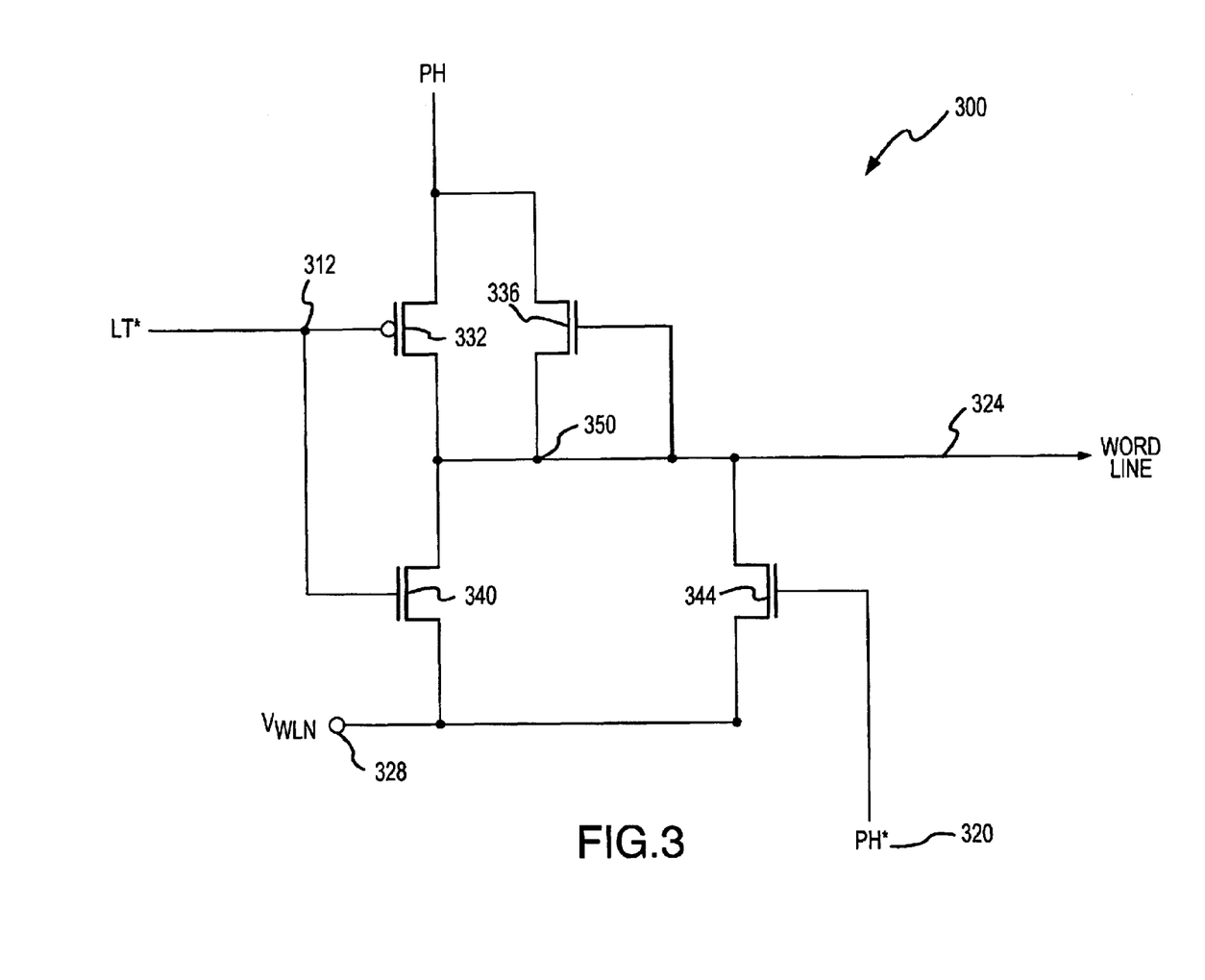
FIG. 3 is a schematic diagram of a negative word line driver using a second embodiment of the present invention coupling the word line to a negative voltage supply to reduce the negative voltage supply capacity required.

FIG. 3 shows a second embodiment of the present invention. As in the case of the embodiments shown in FIGS. 2A and 2B, the word line driver 300 has two states: word line activation mode, during which the word line signal 324 is driven high, and word line deactivation mode, during which the word line signal 324 is driven low. The word line driver 300 receives three inputs, LT* (level translated control line, low enabled), PH (phase), and PH* (phase complement). Word line activation mode occurs when LT* is driven low, PH is driven high, and PH*, as the complement of PH, is driven low. Word line deactivation mode occurs when LT* is driven high, PH is driven low, and/or PH*, as the complement of PH is driven high. The negative word line driver shown in FIG. 3 drives an active word line voltage of Vccp, eg., 3.0 volts, or an inactive word line voltage of Vwln, e.g, −0.3 volts.

It will be appreciated that the word line driver does not receive separate supply lines for Vccp or ground as in the word line drivers 200 (FIG. 2A) and 250 (FIG. 2B), but drives the word line signal 324 (FIG. 3) with voltages received at inputs LT*, PH, and PH*, which range from ground to Vccp. Further, because the word line voltages are supplied through the inputs, the cross coupled translator circuit of PMOS transistors 140 and 144 (FIGS. 1, 2A, and 2B) used to translate an input at Vcc is not needed. As a result, the negative word line driver 300 can be implemented using fewer transistors than the negative word line drivers 200 (FIG. 2A) and 250 (FIG. 2B).

In word line activation mode in the word line driver 300, LT* being driven low applies a low voltage turning ON the gate of PMOS transistor 332, coupling PH to the word line signal 324. PH being coupled to the word line signal 324 also applies a high voltage to the gate of transistor 336 providing diode connection between PH and word line signal 324. At the same time, LT* driving low applies a low voltage to the gate of transistor 340 and turns transistor 340 OFF, uncoupling Vwln 328 from the word line signal 324 at the node 350 where the drain of PMOS transistor 332 and transistor 336 are each coupled to the word line signal 324. At the same time, PH* drives low, turning OFF transistor 344, and also decoupling Vwln 328 from word line signal 324. Thus, with LT* and PH* low and PH high, the word line signal 324 is active, driving Vccp on the word line signal 324.

On the other hand, in word line deactivation mode, LT* is driven high applying a high voltage to the gate of PMOS transistor 332, turning OFF PMOS transistor 332, however, diode-coupled transistor 336 will carry the discharge of word line signal 324 towards ground through the PH signal. LT* being driven high also applies a high voltage to transistor 340, turning ON transistor 340 and coupling Vwln 328 to the word line signal 324. Vwln 328 being coupled to the word line also applies a low voltage to transistor 336, afterward turning OFF transistor 336 and decoupling PH from the word line signal 324. Node 350 being driven low also applies a low voltage to the gate of transistor 336, turning OFF transistor 336 and further preventing PH from being coupled to the word line signal 324. At the same time, PH* driving high turns ON transistor 344, again coupling Vwln 328 to the word line signal 324. Thus, with LT* driving high, PH driving low, and PH* driving high, Vwln 328 and PH, through diode-coupled transistor 336, discharge the word line signal 324.

It will be appreciated that when LT* is driven high, the word line signal 324 goes to Vwln 328 through transistor 340 regardless of the values of PH and PH*. LT* being driven high, as previously described, causes PH to be decoupled from the word line signal 324 because both PMOS transistor 332 and transistor 336 are turned OFF. Even if PH* should drive low, deactivating transistor 344, the word line signal 324 will remain coupled to Vwln 328 through transistor 340. In sum, LT* driving low, PH driving high, and PH* driving low provides Vccp as the word line signal 324, while LT* driving high, regardless of the voltage of PH and PH*, provides Vwln on the word line signal 324.

PH and PH* do not need to be absolutely complementary. It is beneficial, for example, to deactivate the word line by first taking PH to ground while PH* is still low, and LT* is still low. This allows the word line to discharge toward ground before being coupled to Vwln when PH* and LT* are later taken high. Once the word line goes down to within a Vt of both 332 and 336, these two turn off, and 344 can be turned on without coupling Vwln to ground.

In addition, regardless of the voltage applied at LT* 312, if PH is driven to ground, the word line signal 324 will continue to be driven low at Vwln 328 through transistor 344. Even with LT* being driven low, the Vgs of 332 is less than a Vt so PH is not coupled to the word line signal 324 through transistor 332. LT* low also decouples Vwln 328 from the word line signal 324 at transistor 340, PH will apply a low voltage to the word line signal 324 and thus also deactivate transistor 336, decoupling one branch between PH and the word line signal 324. At the same time, PH driving low causes PH* to drive high, applying a high voltage to the gate of transistor 344, coupling Vwln 328 to the word line signal 324. In this situation, the word line driver 300 operates similarly to word line driver 200 (FIG. 2A) and word line driver 250 (FIG. 2B) in the sense that ground is applied to the word line signal 324 (FIG. 3) through one branch, in this case through PMOS transistor 332 and diode-coupled transistor 336, while Vwln 328 is coupled to the word line signal 324 through transistor 344. Also similar to word line driver 200 (FIG. 2A) and word line driver 250 (FIG. 2B), in the word line driver 300 (FIG. 3) a smaller transistor 344 can be used for the Vwln 328 coupling because the transistor 344, unlike transistor 132 (FIG. 1) of the prior art word line driver 100, need not carry the full current load to sink the word line signal 324 (FIG. 3) voltage to Vwln 328. Further, once the word line signal gets within a Vt of ground, the ground path is shut off because the Vgs of 332 is less than the Vt of 332.

Figure 4:
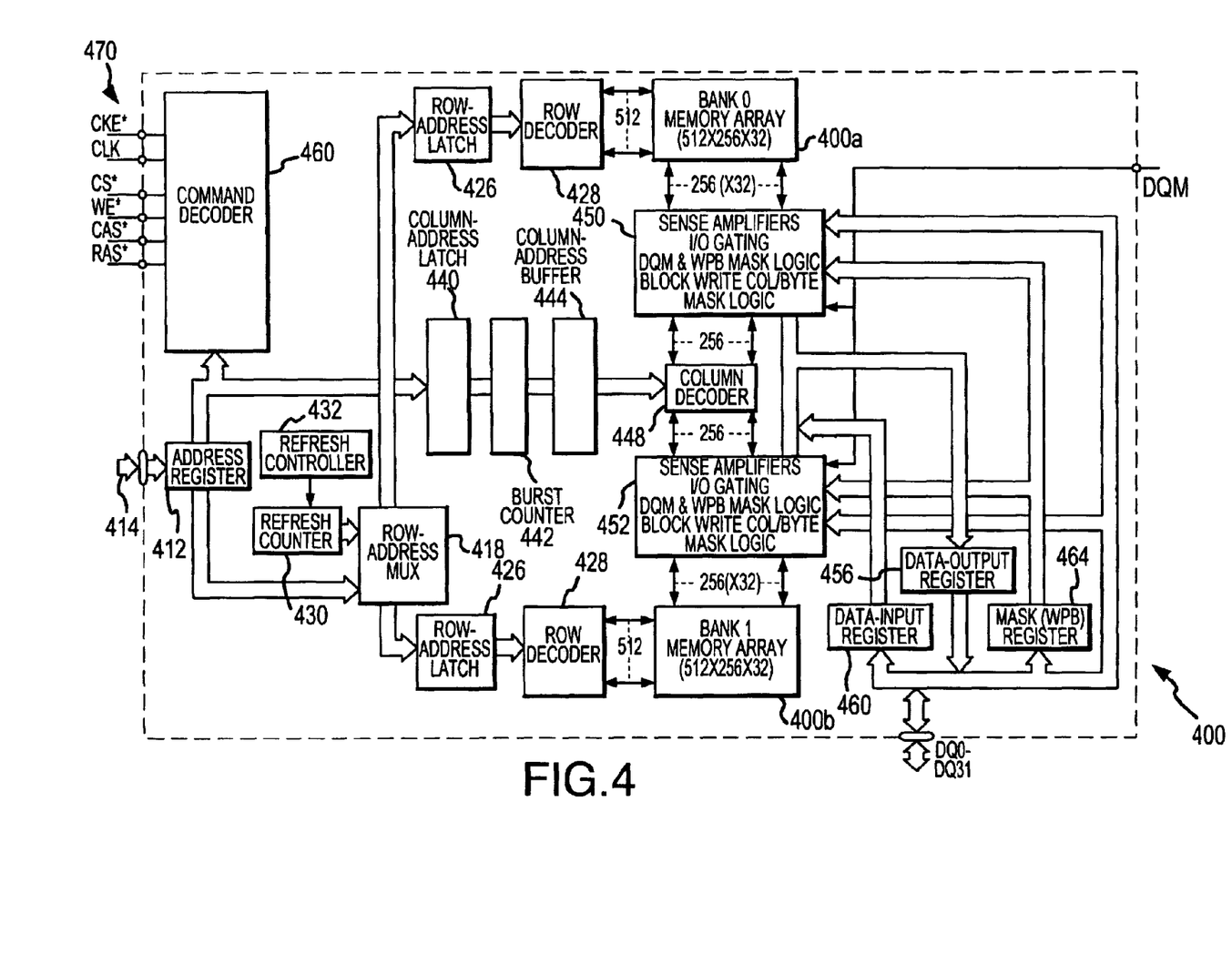
FIG. 4 is a block diagram of a SDRAM device incorporating an embodiment of the present invention.

A memory device employing an embodiment of the present invention is shown in FIG. 4. The memory device shown in FIG. 4 is a synchronous dynamic random access memory ("SDRAM") device 400, although embodiments of the present invention may be used in other DRAMs and other memory devices. The SDRAM device 400 includes an address register 412 that receives either a row address or a column address on an address bus 414. The address bus 414 is generally coupled to a memory controller (not shown). Typically, a row address is initially received by the address register 412 and applied to a row address multiplexer 418. The row address multiplexer 418 couples the row address to a number of components associated with either of two memory arrays 400a, 400b, depending upon the state of a bank address bit forming part of the row address. The memory arrays 400a, 400b have an open-array architecture incorporating one or both embodiments of the invention as shown in FIGS. 3A and 3B. Associated with each of the memory arrays 400a, 400b is a respective row address latch 426, which stores the row address, and a row decoder 428, which applies various signals to its respective memory array 400a or 400b as a function of the stored row address. The row address multiplexer 418 also couples row addresses to the row address latches 426 for the purpose of refreshing the memory cells in the memory arrays 400a, 400b. The row addresses are generated for refresh purposes by a refresh counter 430, which is controlled by a refresh controller 432.

After the row address has been applied to the address register 412 and stored in one of the row address latches 426, a column address is applied to the address register 412. The address register 412 couples the column address to a column address latch 440. Depending on the operating mode of the SDRAM device 400, the column address is either coupled through a burst counter 442 to a column address buffer 444, or to the burst counter 442, which applies a sequence of column addresses to the column address buffer 444 starting at the column address that is stored in the column-address latch. In either case, the column address buffer 444 applies a column address to a column decoder 448, which applies various column signals to respective sense amplifiers and associated column circuitry 450, 452 for the respective memory arrays 400a, 400b.

Data to be read from one of the memory arrays 400a, 400b are coupled to the column circuitry 450, 452 for one of the memory arrays 400a, 400b, respectively. The data are then coupled to a data output register 456, which applies the data to a data bus 458. Data to be written to one of the memory arrays 400a, 400b are coupled from the data bus 458 through a data input register 460 to the column circuitry 450, 452 and then are transferred to one of the memory arrays 400a, 400b, respectively. A mask register 464 may be used to selectively alter the flow of data into and out of the column circuitry 450, 452, such as by selectively masking data to be read from the memory arrays 400a, 400b.

The above-described operation of the SDRAM 400 is controlled by a command decoder 468 responsive to high level command signals received on a control bus 470. These high level command signals, which are typically generated by a memory controller (not shown), are a clock enable signal CKE*, a clock signal CLK, a chip select signal CS*, a write enable signal WE*, a column address strobe signal CAS*, and a row address strobe signal RAS*, with the "*" designating the signal as active low or complement. The command decoder 468 generates a sequence of control signals responsive to the high level command signals to carry out the function (e.g., a read or a write) designated by each of the high level command signals. These control signals, and the manner in which they accomplish their respective functions, are conventional. Therefore, in the interest of brevity, a further explanation of these control signals will be omitted.

Figure 5:
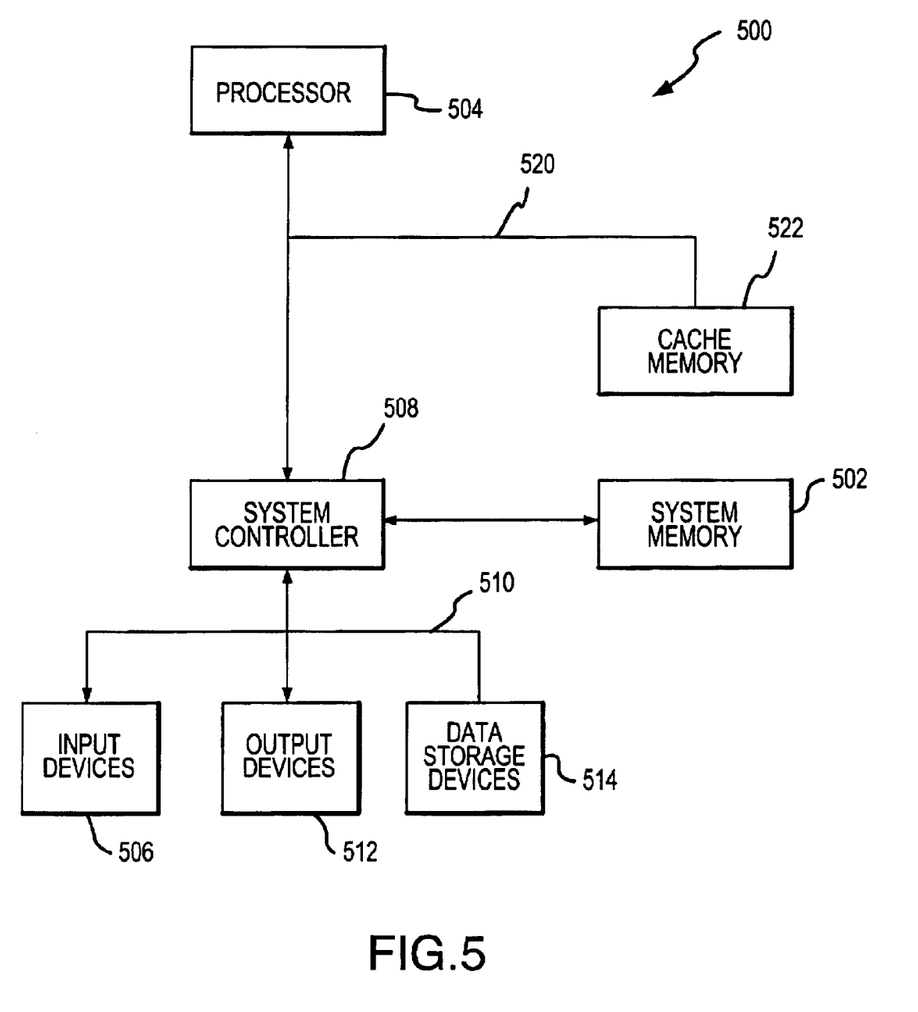
FIG. 5 is a block diagram of a computer system incorporating an embodiment of the present invention.

As shown in FIG. 5, a computer system 500 can take advantage of an embodiment of the present invention by incorporating in its system memory 502 DRAM devices adapted with one or both embodiments of the present invention as previously described. With reference to FIG. 5, a computer system 500 includes the system memory 502 and a processor 504 for performing various functions, such as performing specific calculations or tasks. In addition, the computer system 500 includes one or more input devices 506, such as a keyboard or a mouse, coupled to the processor 504 through a system controller 508 and a system bus 510 to allow an operator to interface with the computer system 500. Typically, the computer system 500 also includes one or more output devices 512 coupled to the processor 504, such output devices typically being a printer or a video terminal. One or more data storage devices 514 are also typically coupled to the processor 502 through the system controller 508 to store data or retrieve data from external storage media (not shown). Examples of typical data storage devices 514 include hard and floppy disks, tape cassettes, and compact disk read-only memories (CD-ROMs). The system memory 502 is coupled directly (not shown) to the processor 504 or to the system controller 508 to allow data to be written to and read from the system memory 502. The computer system 500 may also include a cache memory 522 coupled to the processor 502 through a processor bus 520 to provide for the rapid storage and reading of data and/or instructions, as is well known in the art.

From the foregoing it will be appreciated that, although specific embodiments of the invention have been described herein for purposes of illustration, various modifications may be made without deviating from the spirit and scope of the invention. It will be appreciated that many variations can be applied to the embodiments shown within the broad concepts of the present invention. For example, any combination of output voltages could be generated; the present invention could effectively generate both a word line inactive and a word line active signal of negative voltage, or a word line inactive and a word line active signal both of a positive voltage. As previously described, in either case it is the voltage differential which helps prevent memory cell current leakage, and such leakage could be reduced with any relative voltage differential, whether the word line active and inactive voltages are positive or negative. Accordingly, the invention is not limited except as by the appended claims.

What is claimed is:

1. A word line driver system for developing a voltage on a word line, the word line driver circuit comprising:

a first coupling circuit coupled to the word line and adapted to receive a control input signal and having a first terminal adapted to receive a first reference voltage source, the first coupling circuit operable responsive to the control input signal being active to couple the word line to the first terminal; and a second coupling circuit coupled to the word line and adapted to receive the control input signal, and having first and second terminals adapted to receive second and third reference voltage sources, respectively, the second coupling circuit operable responsive to the control input signal being inactive to couple the word line through an isolation element to the first terminal and operable to couple the word line to the second terminal.

2. The system of claim 1 wherein the second coupling circuit first couples the word line through the isolation element to the first terminal and thereafter couples the word line to the second terminal.

3. The system of claim 1 wherein the first reference voltage comprises an active word line voltage.

4. The system of claim 3 wherein the active word line voltage comprises a positive voltage.

5. The system of claim 1 wherein the lesser of the second reference voltage and the third reference voltage comprises an inactive word line voltage.

6. The system of claim 5 wherein the second reference voltage comprises ground.

7. The system of claim 5 wherein the third reference voltage comprises a negative voltage.

8. The system of claim 1 wherein the isolation element comprises a transistor.

9. The system of claim 1 wherein the isolation element comprises a diode-coupled transistor.

10. The system of claim 1 wherein the isolation element comprises a diode.

11. The system of claim 1 wherein second coupling circuit comprises a coupling transistor having a control input coupled to receive the control input signal and coupled in series with the isolation element between the word line and the second reference voltage source.

12. The system of claim 11 wherein the isolation element is coupled between the coupling transistor and the second reference voltage source.

13. The system of claim 11 wherein the isolation element is coupled between the word line and the coupling transistor.

14. A word line driver system, the word line driver system generating a high word line voltage or a low word line voltage on a word line, the word line driver system comprising:
   a system low voltage source;
   a word line low voltage source;
   a word line high voltage source;
   a plurality of control inputs, a word line high combination of the control inputs signaling the high word line voltage should be generated and a word low combination of the control inputs signaling the low word line voltage should be generated;
   a word line high coupling system receiving the control inputs and the word line high voltage source, the word line high coupling system coupling the word line high voltage source to the word line only upon the word line high combination of control inputs being received; and
   a word line low coupling system receiving the control inputs, the system low voltage source, and the word line low voltage source, the word line low coupling system coupling the word line to both the system low voltage source and the word line low voltage source only upon the word line low combination of control inputs being received.

15. The system of claim 14 wherein the word line low voltage source comprises a negative voltage source.

16. The system of claim 14 wherein the system low voltage source comprises a ground voltage source.

17. The system of claim 14 wherein the word line high voltage source supplies a voltage greater than a maximum voltage of the control inputs.

18. The system of claim 14 wherein the word line low coupling system comprises at least one transistor selectively coupling the system low voltage source to the word line.

19. The system of claim 14 wherein the word line low coupling system comprises at least one transistor selectively coupling the word line low voltage source to the word line.

20. The system of claim 14 wherein the word line low coupling system further comprises an isolation element, the isolation element preventing current from flowing from a higher of voltages carried by the word line low voltage source and the system low voltage source to the lower of the word line low voltage source and the system voltage.

21. The system of claim 20 wherein the isolation element comprises a transistor.

22. The system of claim 20 wherein the isolation element comprises a diode-coupled transistor.

23. The system of claim 20 wherein the isolation element comprises a diode.

24. The system of claim 20 wherein the isolation element comprises an externally controlled transistor coupled to an external isolation input, the external isolation input disabling the externally controlled transistor preventing current from flowing from the higher of the voltages carried by the word line low voltage source and the system low voltage source to the lower of the word line low voltage source and the system low voltage source.

25. The system of claim 14 wherein the word line driver system comprises a translator circuit comprising a pair of cross coupled transistors so the word line high voltage is greater than the voltage of the control inputs.

26. The system of claim 25 wherein the pair of cross coupled transistors comprise a pair of PMOS transistors.

27. The system of claim 14 wherein the word line high coupling system comprises a PMOS transistor coupling the word line high voltage source to the word line.

28. A memory system comprising:
   a memory controller;
   a memory bus operably coupled with the memory controller to communicate memory commands from the memory controller and communicate memory output signals to the memory controller;
   a plurality of DRAM devices comprising a plurality of memory cells, the memory cells being disposed in rows and columns; and
   an addressing system operably connected to the DRAM devices, the addressing system responsive to an address signal by accessing a row and a column in the DRAM devices corresponding to the row address signal by generating a plurality of control inputs to the DRAM devices, a word line high combination of the control inputs signaling the high word line voltage should be generated and a word low combination of the control inputs signaling the low word line voltage should be generated; and
   a word line driver system for developing a voltage on a word line, the word line driver circuit comprising:
      a first coupling circuit coupled to the word line and adapted to receive a control input signal and having a first terminal adapted to receive a first reference voltage source, the first coupling circuit operable responsive to the control input signal being active to couple the word line to the first terminal; and
      a second coupling circuit coupled to the word line and adapted to receive the control input signal, and having first and second terminals adapted to receive second and third reference voltage sources, respectively, the second coupling circuit operable responsive to the control input signal being inactive to couple the word line through an isolation element to the first terminal and operable to couple the word line to the second terminal.

29. The memory system of claim 28 wherein the second coupling circuit first couples the word line through the isolation element to the first terminal and thereafter couples the word line to the second terminal.

30. The memory system of claim 28 wherein the first reference voltage comprises an active word line voltage.

31. The memory system of claim 30 wherein the active word line voltage comprises a positive voltage.

32. The memory system of claim 28 wherein the lesser of the second reference voltage and the third reference voltage comprises an inactive word line voltage.

33. The memory system of claim 32 wherein the second reference voltage comprises ground.

34. The memory system of claim 32 wherein the third reference voltage comprises a negative voltage.

35. The memory system of claim 28 wherein the isolation element comprises a transistor.

36. The memory system of claim 28 wherein the isolation element comprises a diode-coupled transistor.

37. The memory system of claim 28 wherein the isolation element comprises a diode.

38. The memory system of claim 28 wherein second coupling circuit comprises a coupling transistor having a control input coupled to receive the control input signal and coupled in series with the isolation element between the word line and the second reference voltage source.

39. The memory system of claim 38 wherein the isolation element is coupled between the coupling transistor and the second reference voltage source.

40. The memory system of claim 38 wherein the isolation element is coupled between the word line and the coupling transistor.

41. A memory system comprising:
a memory controller;
a memory bus operably coupled with the memory controller to communicate memory commands from the memory controller and communicate memory output signals to the memory controller;
a plurality of DRAM devices comprising a plurality of memory cells, the memory cells being disposed in rows and columns; and
an addressing system operably connected to the DRAM devices, the addressing system responsive to an address signal by accessing a row and a column in the DRAM devices corresponding to the row address signal by generating a plurality of control inputs to the DRAM devices, a word line high combination of the control inputs signaling the high word line voltage should be generated and a word low combination of the control inputs signaling the low word line voltage should be generated; and
a word line driver system, the word line driver system generating a high word line voltage or a low word line voltage on a word line, the word line driver system comprising:
a system low voltage source;
a word line low voltage source;
a word line high voltage source;
a plurality of control inputs, a word line high combination of the control inputs signaling the high word line voltage should be generated and a word low combination of the control inputs signaling the low word line voltage should be generated;
a word line high coupling system receiving the control inputs and the word line high voltage source, the word line high coupling system coupling the word line high voltage source to the word line only upon the word line high combination of control inputs being received; and
a word line low coupling system receiving the control inputs, the system low voltage source, and the word line low voltage source, the word line low coupling system coupling the word line to both the system low voltage source and the word line low voltage source only upon the word line low combination of control inputs being received.

42. The memory system of claim 41 wherein the word line low voltage source comprises a negative voltage source.

43. The memory system of claim 41 wherein the system low voltage source comprises a ground voltage source.

44. The memory system of claim 41 wherein the word line high voltage source supplies a voltage greater than a maximum voltage of the control inputs.

45. The memory system of claim 41 wherein the word line low coupling system comprises at least one transistor selectively coupling the system low voltage source to the word line.

46. The memory system of claim 41 wherein the word line low coupling system comprises at least one transistor selectively coupling the word line low voltage source to the word line.

47. The memory system of claim 41 wherein the word line low coupling system further comprises an isolation element, the isolation element preventing current from flowing from a higher of voltages carried by the word line low voltage source and the system low voltage source to the lower of the word line low voltage source and the system voltage.

48. The memory system of claim 47 wherein the isolation element comprises a transistor.

49. The memory system of claim 47 wherein the isolation element comprises a diode-coupled transistor.

50. The memory system of claim 47 wherein the isolation element comprises a diode.

51. The memory system of claim 47 wherein the isolation element comprises an externally controlled transistor coupled to an external isolation input, the external isolation input disabling the externally controlled transistor preventing current from flowing from the higher of the voltages carried by the word line low voltage source and the system low voltage source to the lower of the word line low voltage source and the system low voltage source.

52. The memory system of claim 41 wherein the word line driver system comprises a translator circuit comprising a pair of cross coupled transistors so the word line high voltage is greater than the voltage of the control inputs.

53. The memory system of claim 52 wherein the pair of cross coupled transistors comprise a pair of PMOS transistors.

54. The memory system of claim 41 wherein the word line high coupling system comprises a PMOS transistor coupling the word line high voltage source to the word line.

55. A computer system, comprising:
a processor;
an input device, operably connected to the processor, allowing data to be entered into the computer system;
an output device, operably connected to the processor, allowing data to be output from the computer system; and
a memory system comprising:
a memory controller;
a memory bus operably coupled with the memory controller to communicate memory commands from the memory controller and communicate memory output signals to the memory controller;
a plurality of DRAM devices comprising a plurality of memory cells, the memory cells being disposed in rows and columns; and
an addressing system operably connected to the DRAM devices, the addressing system responsive to an address signal by accessing a row and a column in the DRAM devices corresponding to the row address signal by generating a plurality of control inputs to the DRAM devices, a word line high combination of the control inputs signaling the high word line voltage should be generated and a word low combination of the control inputs signaling the low word line voltage should be generated; and a word line driver system for developing a voltage on a word line, the word line driver circuit comprising:
- a first coupling circuit coupled to the word line and adapted to receive a control input signal and having a first terminal adapted to receive a first reference voltage source, the first coupling circuit operable responsive to the control input signal being active to couple the word line to the first terminal; and
- a second coupling circuit coupled to the word line and adapted to receive the control input signal, and having first and second terminals adapted to receive second and third reference voltage sources, respectively, the second coupling circuit operable responsive to the control input signal being inactive to couple the word line through an isolation element to the first terminal and operable to couple the word line to the second terminal.

56. The computer system of claim 55 wherein the second coupling circuit first couples the word line through the isolation element to the first terminal and thereafter couples the word line to the second terminal.

57. The computer system of claim 55 wherein the first reference voltage comprises an active word line voltage.

58. The computer system of claim 57 wherein the active word line voltage comprises a positive voltage.

59. The computer system of claim 55 wherein the lesser of the second reference voltage and the third reference voltage comprises an inactive word line voltage.

60. The computer system of claim 59 wherein the second reference voltage comprises ground.

61. The computer system of claim 59 wherein the third reference voltage comprises a negative voltage.

62. The computer system of claim 55 wherein the isolation element comprises a transistor.

63. The computer system of claim 55 wherein the isolation element comprises a diode-coupled transistor.

64. The computer system of claim 55 wherein the isolation element comprises a diode.

65. The computer system of claim 55 wherein second coupling circuit comprises a coupling transistor having a control input coupled to receive the control input signal and coupled in series with the isolation element between the word line and the second reference voltage source.

66. The computer system of claim 65 wherein the isolation element is coupled between the coupling transistor and the second reference voltage source.

67. The computer system of claim 65 wherein the isolation element is coupled between the word line and the coupling transistor.

68. A computer system, comprising:
- a processor;
- an input device, operably connected to the processor, allowing data to be entered into the computer system;
- an output device, operably connected to the processor, allowing data to be output from the computer system; and
- a memory system comprising:
  - a memory controller;
  - a memory bus operably coupled with the memory controller to communicate memory commands from the memory controller and communicate memory output signals to the memory controller;
  - a plurality of DRAM devices comprising a plurality of memory cells, the memory cells being disposed in rows and columns; and
  - an addressing system operably connected to the DRAM devices, the addressing system responsive to an address signal by accessing a row and a column in the DRAM devices corresponding to the row address signal by generating a plurality of control inputs to the DRAM devices, a word line high combination of the control inputs signaling the high word line voltage should be generated and a word low combination of the control inputs signaling the low word line voltage should be generated; and
  - a word line driver system, the word line driver system generating a high word line voltage or a low word line voltage on a word line, the word line driver system comprising:
    - a system low voltage source;
    - a word line low voltage source;
    - a word line high voltage source;
    - a plurality of control inputs, a word line high combination of the control inputs signaling the high word line voltage should be generated and a word low combination of the control inputs signaling the low word line voltage should be generated;
    - a word line high coupling system receiving the control inputs and the word line high voltage source, the word line high coupling system coupling the word line high voltage source to the word line only upon the word line high combination of control inputs being received; and
    - a word line low coupling system receiving the control inputs, the system low voltage source, and the word line low voltage source, the word line low coupling system coupling the word line to both the system low voltage source and the word line low voltage source only upon the word line low combination of control inputs being received.

69. The computer system of claim 68 wherein the word line low voltage source comprises a negative voltage source.

70. The computer system of claim 68 wherein the system low voltage source comprises a ground voltage source.

71. The computer system of claim 68 wherein the word line high voltage source supplies a voltage greater than a maximum voltage of the control inputs.

72. The computer system of claim 68 wherein the word line low coupling system comprises at least one transistor selectively coupling the system low voltage source to the word line.

73. The computer system of claim 68 wherein the word line low coupling system comprises at least one transistor selectively coupling the word line low voltage source to the word line.

74. The computer system of claim 68 wherein the word line low coupling system further comprises an isolation element, the isolation element preventing current from flowing from a higher of voltages carried by the word line low voltage source and the system low voltage source to the lower of the word line low voltage source and the system voltage.

75. The computer system of claim 74 wherein the isolation element comprises a transistor.

76. The computer system of claim 74 wherein the isolation element comprises a diode-coupled transistor.

77. The computer system of claim 74 wherein the isolation element comprises a diode.

78. The computer system of claim 74 wherein the isolation element comprises an externally controlled transistor coupled to an external isolation input, the external isolation input disabling the externally controlled transistor preventing current from flowing from the higher of the voltages carried by the word line low voltage source and the system low voltage source to the lower of the word line low voltage source and the system low voltage source.

79. The computer system of claim 68 wherein the word line driver system comprises a translator circuit comprising a pair of cross coupled transistors so the word line high voltage is greater than the voltage of the control inputs.

80. The computer system of claim 79 wherein the pair of cross coupled transistors comprise a pair of PMOS transistors.

81. The computer system of claim 68 wherein the word line high coupling system comprises a PMOS transistor coupling the word line high voltage source to the word line.

82. A method of developing a voltage on a word line, comprising:

selectively coupling a first reference voltage source to the word line responsive to a control input signal being active;

selectively coupling a second and third reference voltage source to the word line responsive to the control signal being inactive;

coupling the second reference voltage to the word line through an isolation element so that current will not flow from the higher of the second or the third reference voltage source to the lower of the second or the third voltage source.

83. The method of claim 82 further comprising first coupling the word line to the second reference voltage and thereafter coupling the word line to the third reference voltage.

84. The method of claim 82 wherein the first reference voltage comprises an active word line voltage.

85. The method of claim 84 wherein the active word line voltage comprises a positive voltage.

86. The method of claim 82 wherein the lesser of the second reference voltage and the third reference voltage comprises an inactive word line voltage.

87. The method of claim 86 wherein the second reference voltage comprises ground.

88. The method of claim 86 wherein the third reference voltage comprises a negative voltage.

89. The method of claim 82 wherein the isolation element comprises a transistor.

90. The method of claim 82 wherein the isolation element comprises a diode-coupled transistor.

91. The method of claim 82 wherein the isolation element comprises a diode.

92. The method of claim 82 wherein second coupling circuit comprises a coupling transistor having a control input coupled to receive the control input signal and coupled in series with the isolation element between the word line and the second reference voltage source.

93. The method of claim 92 wherein the isolation element is coupled between the coupling transistor and the second reference voltage source.

94. The method of claim 92 wherein the isolation element is coupled between the word line and the coupling transistor.

95. A method of driving a word line by generating a high word line voltage or a low word line voltage on the word line, the method comprising:

receiving a plurality of control inputs, a word line high combination of the control inputs signaling the high word line voltage should be generated and a word low combination of the control inputs signaling the low word line voltage should be generated;

receiving a word line high voltage source, a system low voltage source, and a word line low voltage source;

coupling the word line high voltage source to the word line only upon the word line high combination of control inputs being received; and coupling the word line to both the system low voltage source and the word line low voltage source only upon the word line low combination of control inputs being received, so that the word line low voltage source does not have to sink all the voltage from the word line.

96. The method of claim 95 wherein the word line low voltage source comprises a negative voltage source.

97. The method of claim 95 wherein the system low voltage source comprises a ground voltage source.

98. The method of claim 95 wherein the word line high voltage source supplies a voltage greater than a maximum voltage of the control inputs.

99. The method of claim 95 further comprising preventing current from flowing from a higher of voltages carried by the word line low voltage source and the system low voltage source to the lower of the word line low voltage source and the system voltage.

100. A method of driving a word line by generating a high word line voltage or a low word line voltage on the word line, the method comprising:

receiving a plurality of control inputs comprising a word line high combination of the control inputs signaling the high word line voltage should be generated and a word low combination of the control inputs signaling the low word line voltage should be generated, the control inputs carrying voltages ranging between the high word line voltage and a system low voltage;

receiving a word line low voltage source;

coupling the high word line voltage to the word line only upon the word line high combination of control inputs being received; and coupling the word line to both the system low voltage and the word line low voltage source only upon the word line low combination of control inputs being received, so that the word line low voltage source does not have to sink all the voltage from the word line.

101. The method of claim 100 wherein the word line low voltage source comprises a negative voltage source.

102. The method of claim 100 wherein the system low voltage comprises a ground voltage.

* * * * *